United States Patent [19]

Johnson

[11] Patent Number: 4,918,531
[45] Date of Patent: Apr. 17, 1990

[54] COMMERCIAL MESSAGE TIMER

[75] Inventor: Gene H. Johnson, Indianapolis, Ind.

[73] Assignee: Thomson Consumer Electronics, Inc., Indianapolis, Ind.

[21] Appl. No.: 261,243

[22] Filed: Oct. 25, 1988

[51] Int. Cl.$^4$ .................... H04N 5/262; H04N 5/272
[52] U.S. Cl. .................................. 358/183; 358/181; 358/193.1; 358/908; 455/231
[58] Field of Search ............ 358/181, 183, 22, 191.1, 358/193.1, 908; 455/174, 194, 218, 223, 230, 231

[56] References Cited

U.S. PATENT DOCUMENTS

| | | | |
|---|---|---|---|
| 3,628,153 | 12/1971 | Fukats | 358/908 |
| 4,319,286 | 3/1982 | Hanpachern | 358/908 |
| 4,776,038 | 10/1988 | Testin | 358/193.1 |
| 4,782,401 | 11/1988 | Faerber | 358/908 |

OTHER PUBLICATIONS

Commercial-Killer Improves Programs, Radio-Electronics, Jun. 1950, p. 44.

Primary Examiner—Tommy P. Chin
Attorney, Agent, or Firm—Joseph S. Tripoli; Peter M. Emanuel; Thomas F. Lenihan

[57] ABSTRACT

A commercial message timer, when enabled by a user, stores data indicative of a first tuned station and begins timing a predetermined time period. Upon expiration of the time period, the first tuned station is automatically reselected if it had been deselected after the timer was enabled. In this way a user can avoid a commercial message on a first channel by setting the timer and scanning through other channels, and yet have the receiver return automatically to the first channel at the end of a time period substantially equal to that of a typical commercial message. In another embodiment employing PIX-IN-PIX circuitry, the subject apparatus is responsive to the sequence of (1) enabling the timer and (2) changing channels for automatically moving the desired channel to the insert position. In response to the expiration of the timer period, the program displayed in the insert position is automatically returned to the main display position.

14 Claims, 6 Drawing Sheets

COMMERCIAL MESSAGE TIMER

FIELD OF THE INVENTION

This invention concerns the field of radio/VCR-/television receiver input signal switching controls.

BACKGROUND OF THE INVENTION

It is standard practice in the United States for broadcasters to insert into program material, at various points, a number of commercial messages of the program's sponsors. Many viewers find these messages to be an irritating interruption of their viewing pleasure.

Accordingly, many techniques have been devised in an effort to avoid being subjected to these commercial messages. One such technique is to merely mute the sound via, for example, a mute pushbutton on a remote control handunit. A remote control having such a mute function is known from the RCA CRK33 remote control transmitter handunit manufactured by Thomson Consumer Electronics, Inc., Indianapolis, Indiana. Unfortunately, muting the sound does not remove the video of the unwanted commercial message, and the viewer must watch the commercial in order to know when it has ended, and therefore, when the viewer can "unmute" the sound.

An improved sound muting technique is known from U.S. Pat. No. 3,870,956 (Wolff) issued 11 Mar. 1975. Wolff discloses a circuit to mute the sound of a television receiver for a predetermined time, at the end of which time the receiver sound circuitry is automatically unmuted. The circuitry of Wolff, however, does not affect the video, and thus a viewer is subjected to a series of silent commercial messages.

Of course, a viewer may simply tune to a second channel when a commercial message is displayed on the first tuned channel. A problem with this technique is that the viewer has no way of knowing when the commercial message on the first channel is finished. Consequently, the viewer may be late in returning to the first channel, and may miss a portion of the program he was watching.

SUMMARY OF THE INVENTION

In order to overcome the above-stated problems, it is desirable that a tuning system include a timer circuit which can be enabled by a user, before changing channels to avoid a commercial message, and a memory circuit which, in response to the enabling of the timer, stores data indicative of the currently tuned channel. The timer circuit would, upon expiration of a predetermined time period, return the tuning system to the original channel by use of the stored channel data.

In another embodiment of the invention, a television system having picture-in-picture (PIX-IN-PIX) capability, that is, the capability to produce signals which when displayed include a first program in a main viewing area of a displayed screen and a second program in a secondary (inset) viewing are of same display screen, switches a first program currently selected to occupy the main viewing area to the secondary viewing area in response to the sequence of the enabling of a timer, and a selection of a different program. Upon expiration of the timer period, the first program is redisplayed in the main viewing area.

In a third embodiment of the invention, the controller allows selection of signals from different signal sources such as a VCR, compact disc player, AM/FM stereo tuner or the like, to be substituted for the signal from any other of these sources, during the timed period. Upon expiration of the timed period, the originally selected signal source will be reselected.

DETAILED DESCRIPTION OF THE EMBODIMENTS

The invention will now be described with respect to an embodiment in a television receiver environment, however, it should be understood that the invention is equally applicable to radio receivers and videocassette recorders (VCRs).

Figure 1:
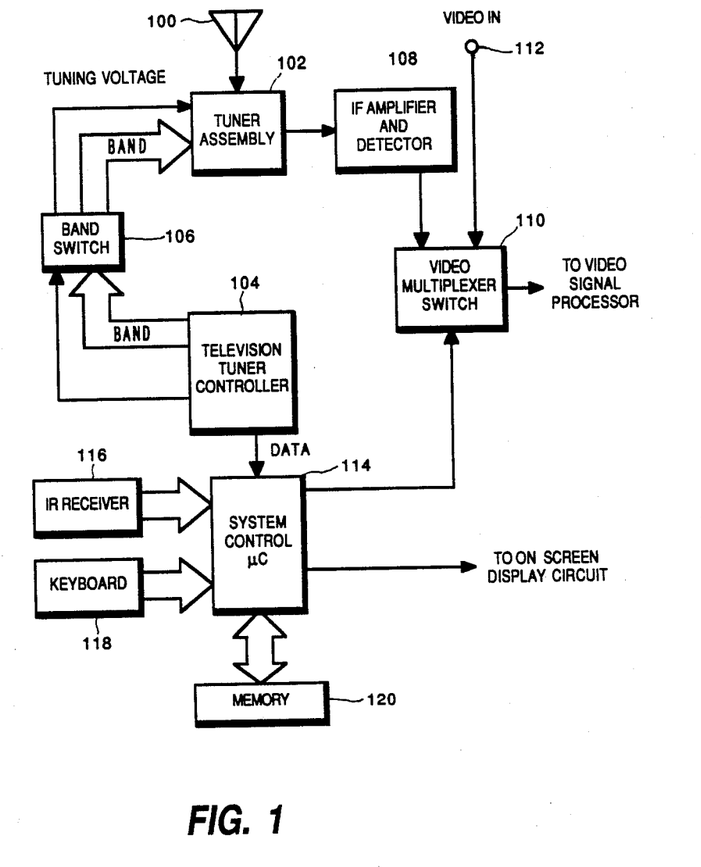
FIG. 1 shows in block diagram form a system suitable for use with the invention.

Referring to FIG. 1, an antenna 100 receives radio frequency (RF) signals and applies them to a tuner assembly 102. Tuner assembly 102 selects and amplifies a particular RF signal under control of a tuner controller 104 which provides bandswitching signals and tuning voltage signals to tuner assembly 102 via a band switch 106.

Tuner assembly 102 converts the received RF signal to an intermediate frequency (IF) signal and provides IF output signal to IF amplifier and detector 108. IF amplifier and detector 108 amplifies the IF signal applied to its input terminal and detects the video information contained therein. This detected video information is then applied as one input to a video multiplexer switch unit 110, the other input of which is connected to a video input terminal 112.

Tuner controller 104 generates the before-mentioned tuning voltage signals and bandswitching signals in response to control signals applied from a system control microcomputer MC 114. Microcomputer 114 receives user-initiated commands from an infrared (IR) receiver 116 and from a keyboard 118. Microcomputer 114 includes program member (ROM) (not shown) and stores channel-related data in a random access memory (RAM) 120. RAM 120 may be of either the volatile or non-volatile type. One skilled in the art will recognize that if volatile memory is utilized that it may be desirable to use a suitable form of standby power to preserve its contents when the receiver is tuned off.

Video multiplexer switch unit 110, under control of system control microcomputer 114, selects either a video signal derived from a received RF signal, or a video signal input at terminal 112, for connection to a video signal processor (not shown).

Figure 2:
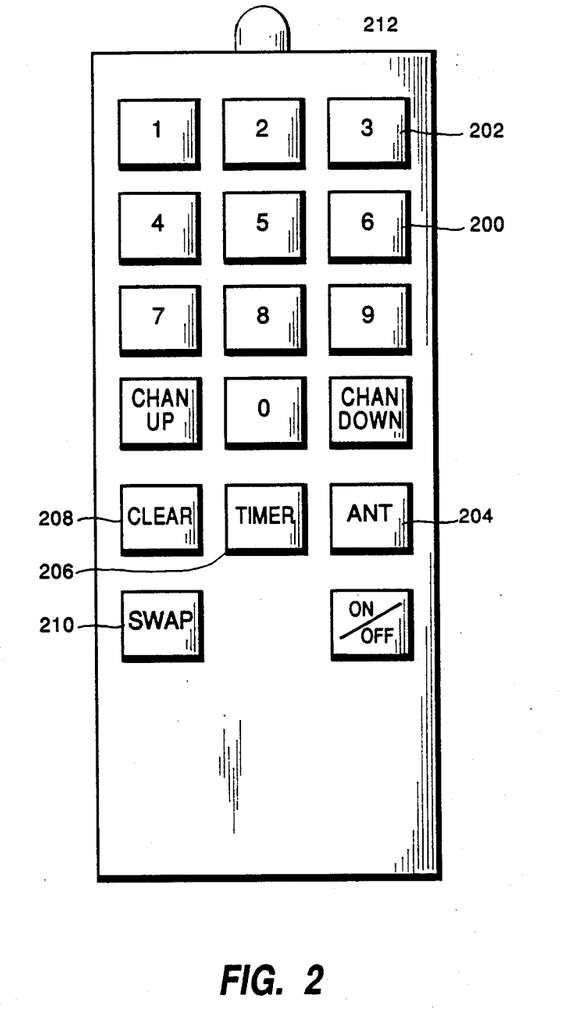
FIG. 2 illustrates a remote control handunit suitable for use with the invention.

IR receiver 116 receives IR signals transmitted by, for example, a remote control handunit such as the one shown in FIG. 2 and designated 200. Remote control handunit 200 may include keys 202 for entering the digits 0-9, for entering channel up and channel down commands and for turning the receiver on and off. Remote control handunit 200 may also include a key 204 (labelled ANT) for selecting, as a signal source, either the antenna, or a video input terminal, via control of multiplexer switch unit 110. Remote control handunit 200 may also include a key 206 (labelled TIMER), a key 208 (labelled CLEAR), and a key 320 (labelled SWAP), the operation of which will be described below. Remote control handunit 200 includes therein electronic circuitry (not shown) for encoding a signal to be transmitted by an IR diode 212 in accordance with the particular keys pressed.

Operation of the apparatus illustrated in FIGURES 1 and 2 will now be described with reference to FIGS. 3 and 4.

If a viewer is watching a television program on, for example, channel 3, and the television program is interrupted for a commercial message, the viewer may avoid receiving the commercial message by pressing timer key 206 of remote control handunit 200, and then tuning other channels in the usual way.

Figure 3:
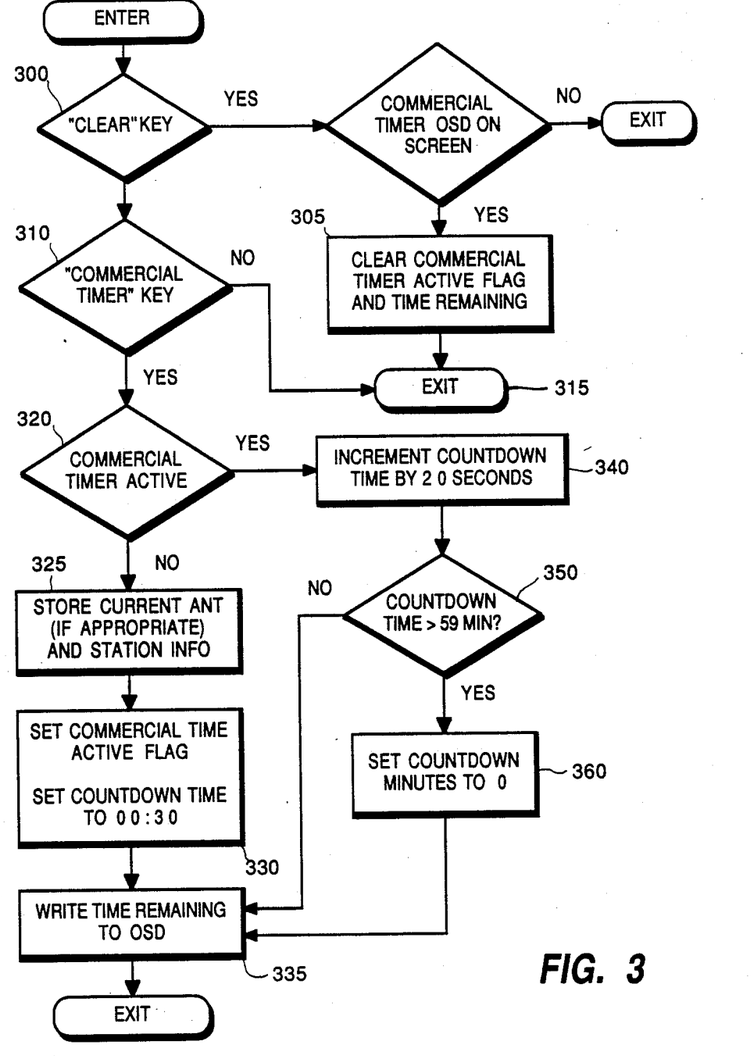
FIGS. 3 and 4 are flowcharts of a program used by the controller of FIG. 1, and are useful in understanding the invention.

When system control microcomputer 114 receives IR or keyboard data, it enters a keycode decoding routine, the relevant portion of which is shown in the flowchart of FIG. 3. The illustrated portion of the decoding program first checks (step 300) to see if the received code is the CLEAR keycode. If the CLEAR key has been pressed, then the timing function will be terminated, and the receiver will not automatically return to the stored channel. If the received keycode is not the CLEAR keycode, the routine next checks (step 310) for the "commercial timer" or TIMER keycode. If the TIMER keycode is not received, the program is exited (step 315). However, if the TIMER keycode is received, the program determines if the commercial timer is active (step 320). If not, the current status of the antenna switch is stored (step 325) (if the receiver is so equipped), data indicative of the currently tuned station is stored in memory 120, the commercial timer active flag is set (setup 330), and the timer count is set to an initial time period of 30 seconds (commercial messages, often simply referred to as "commercials" are usually presented in multiples of 30 seconds in the U.S.). The time remaining in the count is displayed on the display screen via an on-screen display (OSD) integrated circuit 335. Displaying the remaining time on the receiver screen reminds the viewer that he has selected the timer function, and that at the end of the timer period, the receiver will automatically return the tuner to the channel watched when the timer function was initiated, unless the viewer cancels the timer function by pressing the 'clear' key. This feature prevents a viewer (who may have forgotten that he engaged the timer) from being surprised when the stored channel is automatically returned upon the expiration of the timer period.

If during the decoding of the received keycode it is determined that the keycode is the TIMER keycode and the timer is already active, then the time period is incremented by 30 seconds (step 340). Because the timer is already active, and channel data is already stored, it is assumed that the viewer merely wants to extend the time for viewing the currently tuned channel Therefore, upon second and subsequent TIMER keypresses, data relating to the currently tuned channel is not stored. The maximum timer period may be set to any value by the system designer and programmed into system ROM. In the illustrated embodiment the maximum time period is 1 hour (step 350). If the timer period is incremented by a viewer beyond 59 minutes, the preferred operation is that the timer "wraps around" to 0 minutes without clearing the seconds (step 360). This operation is preferred because the viewer has selected the timer function, and therefore the timer function should be performed. In this case, the timer function is executed by timing the remaining seconds until 0:00. Alternatively, incrementing beyond 59 minutes could be treated in the same way as a CLEAR command. This is not preferred because the viewer, in this case, has selected the timer function, and has not issued CLEAR command, but nonetheless, the timer function is terminated.

Of course, the timer period need not be incremented in discrete units of 30 seconds as described above. Alternatively, the timer period may be entered digit by digit via the numbered keys of remote control handunit 200, after a initial activation of the TIMER key.

Figure 4:
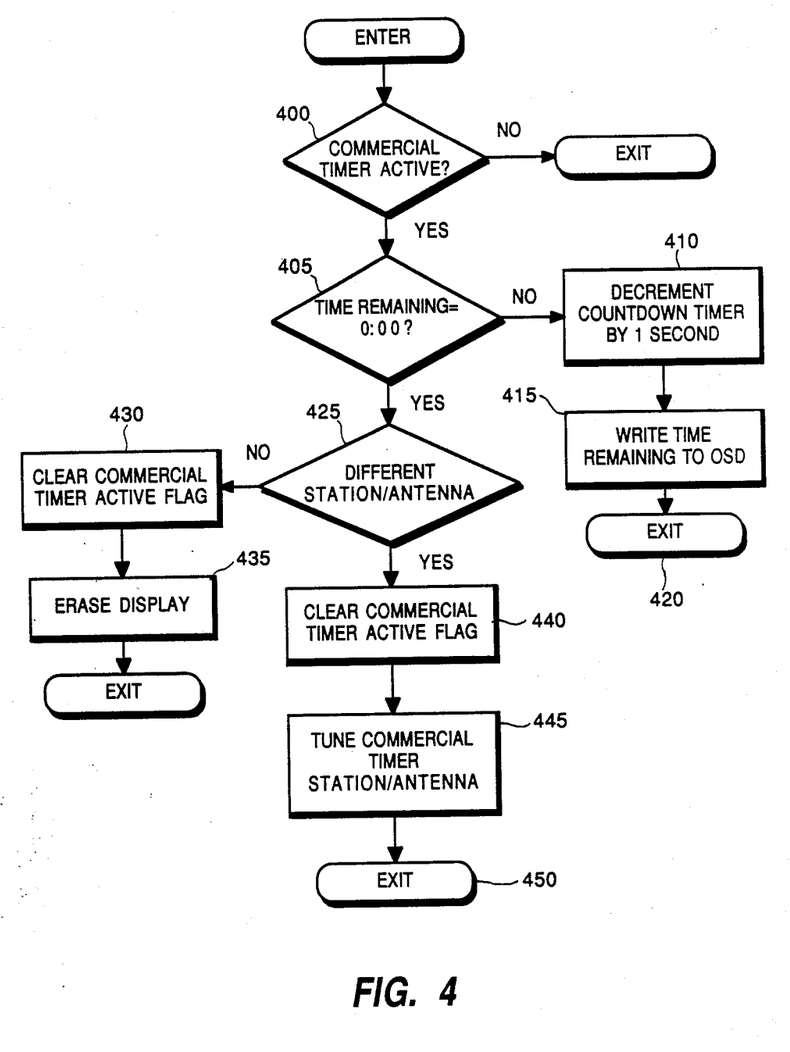

The portion of the program of microcomputer 114 illustrated by the flowchart of FIG. 4 is entered once each second in response to an interrupt (which may be derived by a counter (not shown) counting cycles of the AC line). Upon entering this portion of the program, microcomputer 114 checks to see if the commercial timer is active (step 400). If not, the routine is exited. If so, a check of time remaining is made (step 405), and if the timer count is not equal to 0 minutes, 0 seconds, the count is decremented by 1 second (step 410), the remaining time is sent to the OSD circuit for display (step 415), and the routine is exited (step 420). If the time in the counter is equal to 0 minutes, 0 seconds, then the channel memory 120 is addressed, and a comparision made (step 425) to determine if the receiver is currently tuned to the channel which was tuned when the timer key was pressed. (If the receiver is equipped with a video multiplexer switch unit 110 for switching between an antenna derived signal and a baseband video signal, then a check of video multiplexer switch unit status would also be made.) If the receiver is tuned to the same channel, then no action need be taken other than to clear the commercial timer active flag (step 430), and remove the "time remaining" display from the screen (step 435). If the current channel (or video multiplexer switch unit status) is different from the stored channel (or video multiplexer switch unit status) then the commercial tuner active flag is cleared step 440), the stored channel selected and the video multiplexer switch unit status, if applicable, is restored (step 445), and the program exited (step 450).

In another embodiment of the invention, a television system (i.e. television receiver, VCR, or videodisc player) includes PIX-IN-PIX (picture-in-picture) capability wherein a secondary television picture, derived from a different source than the main picture, is displayed in smaller form and is usually located in an inset in a corner of the television screen.

Figure 5:
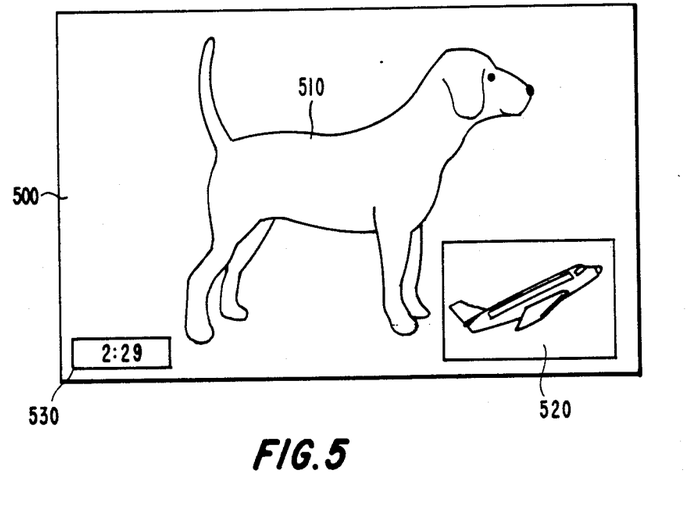
FIG. 5 illustrates a display screen suitable for use with an aspect of the invention.

FIG. 5 illustrates such a PIX-IN-PIX display on a television screen 500. The main picture 510 is displayed over the majority of the display screen, while the secondary picture is displayed in an inset 520 in smaller form. The positions of the programs displayed as the main picture and secondary picture may be interchanged by the use of a SWAP key 210 on remote control handunit 200.

When a commercial message appears in a first program (displayed as the main picture), a viewer, in accordance with another aspect of this invention, may start the timer and, by changing channels move the first program to the inset position, and the newly selected channels to the main position. In this way, the first program is displayed in the inset position, and the viewer is free to change the channel displayed in the main screen during the timer period. The first program will return automatically to the main display area when the timer period expires. The timer remaining 530 is displayed on the screen as a reminder to the viewer that the timer is engaged, and that the original program will be redisplayed in the main screen at the end of the timer period. Note that the first program is transferred to the inset position only if a different channel had been selected. If no different channel is selected, then only a timer function is enabled, with no video signal switching required. Note that upon expiration of the timed period, the original program can alternatively be redisplayed over the entirety of the screen, thus cancelling the PIX-IN-PIX function.

Although the diagram of FIG. 1 shows a single tuner and a separate video input, the scope of the invention is intended to encompass signals derived from multiple tuners, or multiple baseband sources (audio or video) or any combination thereof, so long as signal selection data relating to a first signal is stored, a timer is engaged and the stored signal selection data is used to automatically reselect the first signal when the time period expires.

In this regard, and in accordance with another aspect of the invention, the system controller may control more than one kind of signals. For example, the RCA Dimensia System manufactured by Thomson Consumer Electronics, Inc., Indianapolis, Indiana, controls, via a common control bus, various audio and video sources, such as an audio amplifier, an AM/FM stereo tuner, a compact disc player, and a VCR, in addition to controlling a video monitor.

If the present invention were incorporated into such a system, then it would be possible to engage the timer when a television or radio commercial begins, and via commands on the common control bus, switch to another signal source such as a CD player to listen to music during the timer period. The controller would, as described above, return to the original signal source upon the expiration of time period. Such a system is illustrated in simplified form in FIG. 6. Similarly numbered elements in FIGS. 1 and 6 perform similar functions. The elements numbered 600'-612', and 604" provide for alternate selection of audio sources in similar fashion to alternate selection of images. For example, CD player 612' provides a baseband audio signal, and is thus similar to terminal 612 at which is developed a baseband video signal. Note that in this case, the "tuning" information stored also includes which device was active when the timer was engaged.

Figure 6:
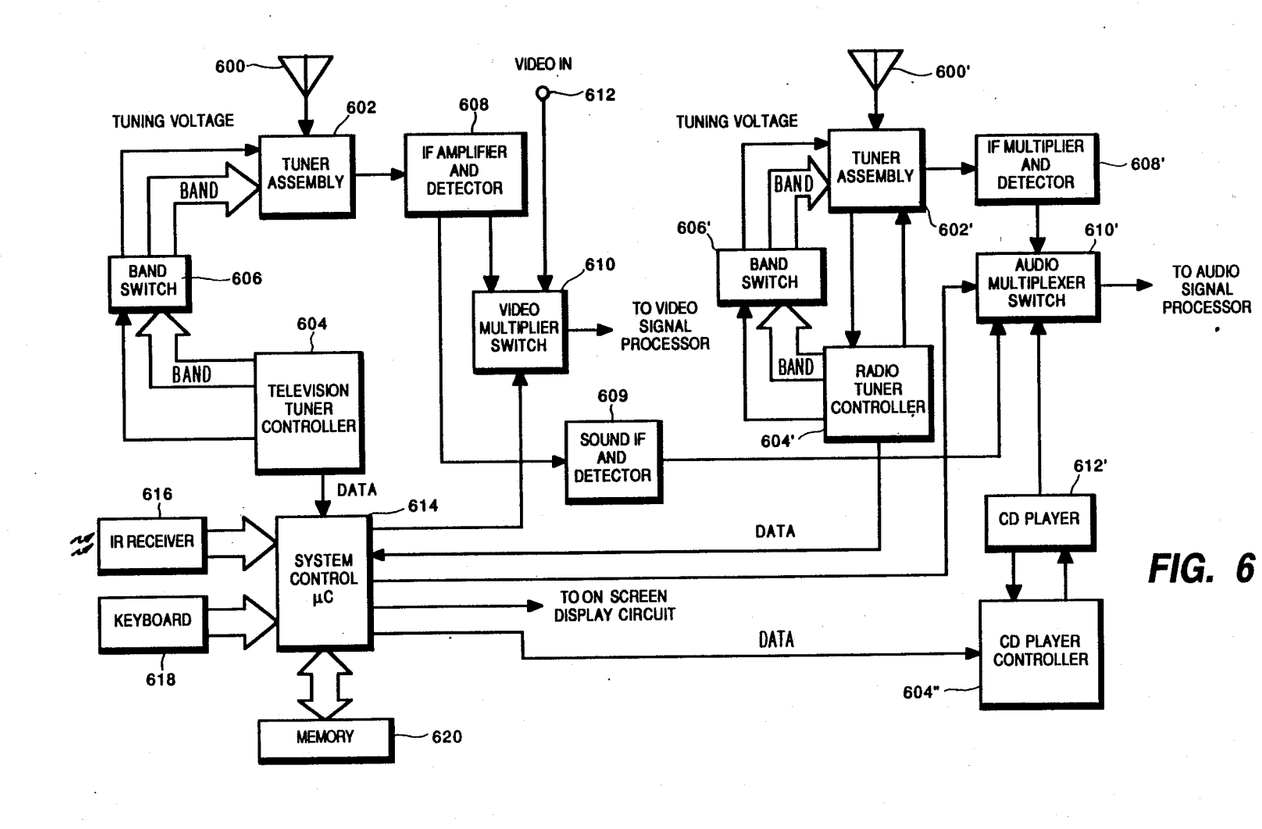
FIG. 6 illustrates, in block diagram form, apparatus suitable for use with another aspect of the invention.

As shown in FIG. 6 an audio multiplexer switch unit 610' is capable of selecting television audio signals, radio audio signals, or CD player audio signals, for further processing by an audio signal processor (not shown). Thus, during a television commercial message, system control microcomputer 614 may condition audio multiplexer switch unit 610' to disconnect the television audio signal and allow the user to substitute, for the timer period, an audio signal from either the radio or a CD player. For simplicity, the controller for a VCR is not shown, but it is to be understood that the video signals developed at terminal 612 may be provided by a VCR.

What is claimed is:

1. A signal selection system, comprising:
   selecting means for selecting, in response to a selection signal, a particular signal from a plurality of signals which may be presented thereto;
   control means coupled to said selecting means for generating said selection signal for controlling the selection of said particular signal from said plurality of signals; said control means having an input for receiving a timer start signal;
   said control means including timer means responsive to said timer start signal for timing a predetermined time period; and
   memory means coupled to said control means for storing, in response to said timer start signal, data relating to the selection of said particular signal; said control means generating said selection signal for selecting said particular signal in accordance with said stored data upon expiration of said predetermined time period if a different one of said plurality of signals were selected after the occurance of said timer start signal and during said predetermined time period.

2. Apparatus for use in a radio frequency (RF) signal receiver, comprising:
   data input means for generating data in response to activation by a user;
   control means coupled to said data input means for generating a tuning control signal in response to said data received from said data input means;
   tuning means responsive to said tuning control signal for selecting an RF signal from a plurality of RF signals applied thereto;
   memory means coupled to said control means for storing data relating to said tuning control signal;
   timing means coupled to said control means for timing a predetermined period;
   said control means in response to data from said data input means causes said memory means to store channel data indicative of a first tuned channel, and causes said timing means to begin timing said predetermined time period, and, upon expiration of said predetermined time period said control means causes said tuning means to tune said first tuned channel in accordance with said stored channel data, if said tuning means were tuned to a different channel during said predetermined time period.

3. The apparatus of claim 2 wherein said control means in a microcomputer.

4. The apparatus of claim 3 further including means coupled to said control means for producing a signal indicative of the time remaining in said predetermined time period.

5. The apparatus of claim 2, wherein said predetermined timing period is changed in response to said data input by a user.

6. Apparatus for use in a television system, comprising:
   control means for generating a video signal selection control signal in response to data;
   data input means coupled to said control means for generating said data in response to activation by a user;
   video signal selection means including tuning means responsive to said video signal selection control signal for selecting a television channel from a plurality of RF signals corresponding to respective television channels applied thereto;
   memory means coupled to said control means for storing data relating to said video signal selection control signal;
   timing means coupled to said control means for timing a predetermined time period;

said control means causes said memory means to store video signal selection data indicative of the currently selected video signal, and causes said timing means to begin timing said predetermined time period, and, upon expiration of said predetermined time period, said control means causes said video signal selection means to reselect said selected video signal in accordance with said stored video signal selection data, if said video signal selection means were controlled to select a different video signal during said predetermined time period.

7. The apparatus of claim 6 wherein said control means is a microcomputer.

8. The apparatus of claim 7 further including means coupled to said control means for producing a signal indicative of the time remaining in said predetermined time period.

9. The apparatus of claim 8 wherein said predetermined time period is changed in response to said data input by a user.

10. The apparatus of claim 9, wherein said video signal selection means further includes a video multiplexer switch unit for selecting a baseband video signal which may be provided by a baseband video signal source, and said video signal selection data includes the state of said video multiplexer switch unit.

11. The apparatus of claim 9 wherein said television system further includes means for combining first and second video signals from respective independent sources to produce first and second combined signals, said first combined signal producing when displayed a combined image having a first portion corresponding to said first video signal displayed in a first area of a display screen and a second portion corresponding to said second video signal displayed in a second area of said display screen;

said control means causing said memory means to store in response to a timer start signal, data indicative of a particular signal to be displayed in said first area of said display screen;

said control means being responsive to an occurrence of said timer start signal and the selection of a third signal in that order for causing said combining means to produce said second combined signal wherein said first portion of said image occupies said second screen area when displayed;

said control means causing said combining means to produce said first combined signal wherein said first portion of said image occupies said first screen area when displayed, in response to the expiration of said predetermined timer period if said first signal had occupied said second screen area after said timer start signal occurred and during said predetermined time period.

12. The apparatus of claim 11 wherein upon expiration of said time period said first signal is caused to occupy the entirety of said display screen.

13. The apparatus of claim 10 wherein said television system further includes means for combining first and second video signals from respective independent sources to produce first and second combined signals, said first combined signal producing when displayed a combined image having a first portion corresponding to said first video signal displayed in a first area of a display screen and a second portion corresponding to said second video signal displayed in a second area of said display screen;

said control means cuasing said memory means to store, in response to a timer start signal, data indicative of a particular signal to be displayed in said first area of said display screen;

said control means being responsive to an occurrence of said timer start signal and the selection of a third signal in that order for causing said combining means to produce said second combined signal wherein said first portion of said image occupies said second screen area when displayed;

said control means causing said combining means to produce said first combined signal wherein said first portion of said image occupies said first screen area when displayed, in response to the expiration of said predetermined time period if said first signal had occupied said second screen area after said timer start signal occurred and during said predetermined time period.

14. The apparatus of claim 13 wherein upon expiration of said time period said first signal is caused to occupy the entirety of said display screen.

* * * * *